(12) United States Patent
Horng et al.

(10) Patent No.: US 9,088,272 B1
(45) Date of Patent: Jul. 21, 2015

(54) FREQUENCY SHIFT-KEYING READER CIRCUIT

(71) Applicant: NATIONAL SUN YAT-SEN UNIVERSITY, Kaohsiung (TW)

(72) Inventors: Tzyy-Sheng Horng, Kaohsiung (TW); Rong-Fu Ye, Kaohsiung (TW); Jian-Ming Wu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/273,725

(22) Filed: May 9, 2014

(30) Foreign Application Priority Data

Jan. 17, 2014 (TW) .............................. 103101890 A

(51) Int. Cl.

| | |
|---|---|
| *H03D 3/00* | (2006.01) |
| *H04L 27/14* | (2006.01) |
| *H03K 5/04* | (2006.01) |
| *H03K 5/02* | (2006.01) |
| *H03H 11/32* | (2006.01) |
| *H03H 11/04* | (2006.01) |

(52) U.S. Cl.
CPC ................. *H03K 5/04* (2013.01); *H03H 11/04* (2013.01); *H03H 11/32* (2013.01); *H03K 5/02* (2013.01)

(58) Field of Classification Search
CPC     H04L 27/1525; H04W 52/0209; H04B 1/406
USPC .......................................... 375/316, 324, 334
See application file for complete search history.

(56) References Cited

U.S. PATENT DOCUMENTS

| | | | |
|---|---|---|---|
| 6,029,052 A * | 2/2000 | Isberg et al. .................... 455/131 |
| 7,072,424 B2 * | 7/2006 | Forrester ....................... 375/316 |
| 7,477,886 B1 * | 1/2009 | Wong ............................ 455/314 |
| 7,564,929 B2 * | 7/2009 | Lopez Villegas et al. ..... 375/329 |
| 8,680,929 B2 * | 3/2014 | De Jong et al. .................. 331/45 |
| 8,929,486 B2 * | 1/2015 | Xu et al. ......................... 375/327 |
| 2009/0163165 A1 * | 6/2009 | Oomoto ....................... 455/253.2 |
| 2011/0223875 A1 * | 9/2011 | Hamano ...................... 455/127.1 |
| 2015/0139363 A1 * | 5/2015 | Lin et al. ........................ 375/334 |

OTHER PUBLICATIONS

Wang et al., A 1.13 μm CMOS 2.5 Gb/s FSK Demodulator Using Injection-Locked Technique, 2009 IEEE Radio Frequency Integrated Circuits Symposium, pp. 563-566.*
Rong-Fu Ye, Design of Wideband and Low-Power CMOC RFICs with Integrated Passive Devices, Doctorate Dissertation of National Sun Yat-sen University, Oct. 24, 2013.
Rong-Fu Ye et al., Low Power FSK Receiver Using an Oscillator-Based Injection-Locked Frequency Divider, Microwave and Wireless Components Letters, IEEE (Volume:PP, Issue: 99 ), Dec. 5, 2013.

* cited by examiner

*Primary Examiner* — Freshteh N Aghdam
(74) *Attorney, Agent, or Firm* — Jackson IPG PLLC; Demian K. Jackson

(57) ABSTRACT

A frequency shift-keying reader circuit includes a band-pass filter, a low noise amplifier, a first balun, an injection-lock divide-by-2 frequency divider, a sub-harmonic mixer and a low-pass filter. The band-pass filter performs a filtering procedure to a radio frequency signal, wherein the filtered radio-frequency signal is received by the low noise amplifier to provide an injection signal, and the injection signal is received by the first balun to generate a first differential signal and a second differential signal. The injection signal is received by the injection-lock divide-by-2 frequency divider to provide a first oscillation signal and a second oscillation signal, wherein the first differential signal, the second differential signal, the first oscillation signal and the second oscillation signal are received by the sub-harmonic mixer for performing a mixing procedure and thereafter generating an output signal, the low-pass filter performs a filtering procedure to the output signal.

15 Claims, 4 Drawing Sheets

FREQUENCY SHIFT-KEYING READER CIRCUIT

FIELD OF THE INVENTION

The present invention is generally relating to a frequency shift-keying reader circuit, more particularly to the frequency shift-keying reader circuit with characteristic of injection lock.

BACKGROUND OF THE INVENTION

A conventional frequency shift-keying reader circuit comprises a band-pass filter, an injection-locked oscillator and a multiplier. The low-pass filter receives an input signal and performs a filtering procedure to the input signal. The injection locked oscillator receives the filtered input signal. Besides, the injection-locked oscillator is locked by the filtered input signal and outputs an oscillation signal. The input signal and the oscillation signal are received by the multiplier so as to perform a mixing procedure. Thereafter, an output signal is outputted from a low-pass filter after a filtering procedure of the low-pass filter. The operational frequency of modern wireless radio frequency achieves Giga Hertz level, the higher the operational frequency, the larger the power consumption for the frequency shift-keying reader circuit. Therefore, the conventional frequency shift-keying reader circuit acquires stable demodulating quality under the condition of high DC power consumption. The conventional frequency shift-keying reader circuit does not meet the Spec demand of short distance wireless communication characterized in low power consumption. Besides, owing to low isolation from the local oscillation port of the conventional frequency shift-keying reader circuit to the radio frequency signal, the output signal outputted from the multiplier further includes a self-mixing component of local oscillation signal. The self-mixing component is a DC displacement therefore increasing the bit error rate of the demodulating signal.

SUMMARY

A primary object of the present invention is to make a lock frequency of a divide-by-2 frequency divider become half the operational frequency of a radio frequency signal to lower the power consumption of the frequency shift-keying reader circuit. Besides, by a mixing procedure of a sub-harmonic mixer, the frequency shift-keying reader circuit possesses high signal isolation to effectively decrease the DC displacement output of the frequency shift-keying reader circuit therefore improving the sensitivity of the frequency shift-keying reader circuit. Furthermore, the frequency shift-keying reader circuit possesses the function of low power consumption.

A frequency shift-keying reader circuit includes a band-pass filter, a low noise amplifier, a first balun, an injection-lock divide-by-2 frequency divider, a sub-harmonic mixer and a low-pass filter. The band-pass filter receives a radio frequency signal and performs a filtering procedure, wherein the radio frequency signal comprises an operational frequency. The low noise amplifier connects to the band-pass filter and receives the filtered radio frequency signal, wherein the low noise amplifier is used for amplifying the radio frequency signal to provide an injection signal. The first balun connects to the low noise amplifier and receives the injection signal, the first balun generates a first differential signal and a second differential signal, wherein the first differential signal and the second differential signal are mutually inverted. The injection-lock divide-by-2 frequency divider connects to the low noise amplifier and receives the injection signal, the injection-lock divide-by-2 frequency divider is locked at a lock frequency by the injection signal, the lock frequency is half the operational frequency, the injection-lock divide-by-2 frequency divider provides a first oscillation signal and a second oscillation signal, wherein the first oscillation signal and the second oscillation signal are mutually inverted. The sub-harmonic mixer connects to the first balun and the injection-lock divide-by-2 frequency divider, the sub-harmonic mixer receives the first differential signal, the second differential signal, the first oscillation signal and the second oscillation signal for performing a mixing procedure and thereafter generates an output signal. The low-pass filter connects to the sub-harmonic mixer and performs a filtering procedure to the output signal.

In the present invention, the lock frequency of the injection-lock divide-by-2 frequency divider is half the operational frequency of the injection signal, thus, the power consumption for injection lock is well reduced. Besides, due to excellent isolation of the sub-harmonic mixer, the DC displacement output of the frequency shift-keying reader circuit may be lowered effectively therefore making the sensitivity of the frequency shift-keying reader circuit improved substantially. The frequency shift-keying reader circuit in the present invention meets the Spec demand of short distance wireless communication owing to the characteristics of low power consumption and high sensitivity.

DETAILED DESCRIPTION OF THE INVENTION

Figure 1:
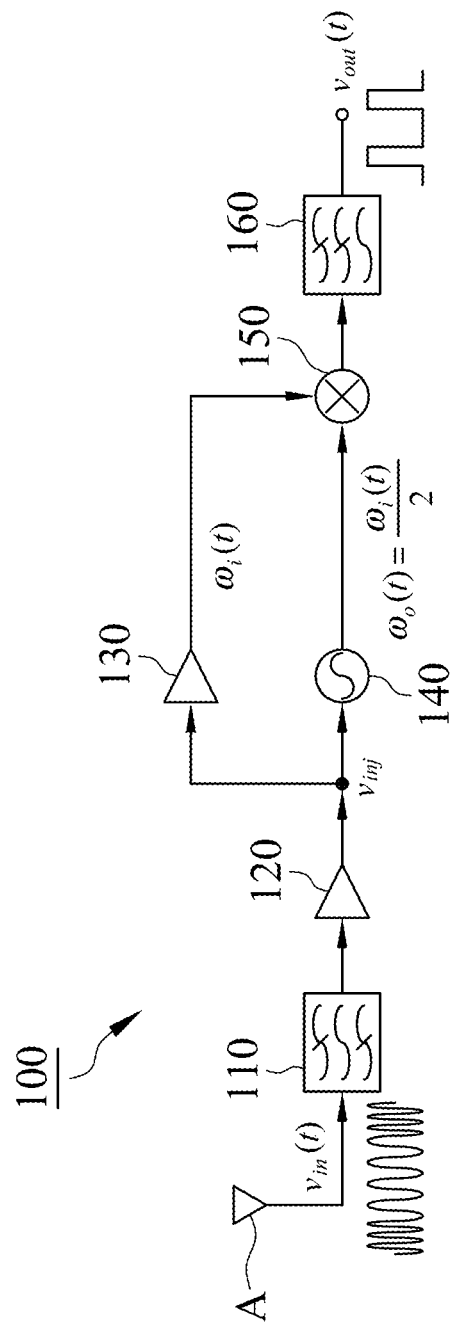
FIG. 1 is the diagram illustrating a frequency shift-keying reader circuit in accordance with an embodiment of the present invention.

Please refer to FIG. 1, a frequency shift-keying reader circuit 100 in accordance with an embodiment of the present invention includes an antenna A, a band-pass filter 110, a low noise amplifier 120, a first balun 130, an injection-lock divide-by-2 frequency divider 140, a sub-harmonic mixer 150 and a low-pass filter 160.

Figure 2:
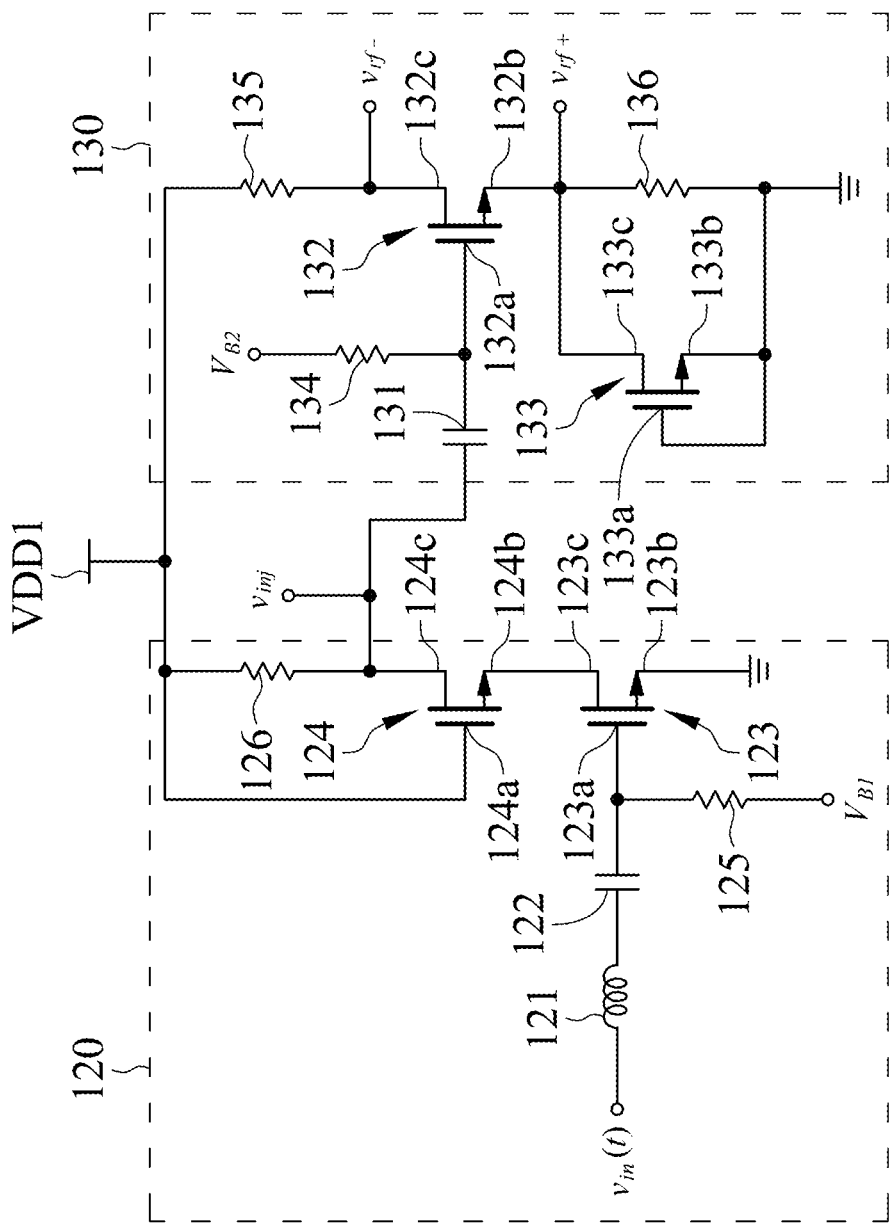
FIG. 2 is the circuit diagram illustrating a low noise amplifier and a first balun in accordance with the embodiment of the present invention.

Please refer to FIGS. 1 and 2, the antenna A is used for receiving a radio frequency signal $v_{in}(t)$ and transmitting the radio frequency signal $v_{in}(t)$ to the band-pass filter 110, the radio frequency signal $v_{in}(t)$ comprises an operational frequency $\omega_i(t)$, wherein the band-pass filter 110 connects to the antenna A, the band-pass filter 110 receives the radio frequency signal $v_{in}(t)$ and performs a filtering procedure, and the low noise amplifier 120 connects to the band-pass filter 110 and receives the filtered radio frequency signal $v_{in}(t)$.

With reference to FIG. 2, in this embodiment, the low noise amplifier 120 is a cascade amplifier, and the low noise amplifier 120 comprises an inductor 121, a first capacitor 122, a first N-type transistor 123, a second N-type transistor 124, a first bias resistor 125 and a first resistor 126. One end of the inductor 121 of the low noise amplifier 120 receives the filtered radio frequency signal $v_{in}(t)$, the other end of the inductor 121 connects to one end of the first capacitor 122, the other end of the first capacitor 122 connects to a gate terminal 123a of the first N-type transistor 123 to make the first N-type transistor 123 receive the filtered radio frequency signal $v_{in}$(t). The gate terminal 123a of the first N-type transistor 123 receives a first bias voltage $V_{B1}$ via the first bias resistor 125, a source terminal 123b of the first N-type transistor 123 is grounded, a source terminal 124b of the second N-type transistor 124 connects to a drain terminal 123c of the first N-type transistor 123, wherein a gate terminal 124a of the second N-type transistor 124 connects to a first power terminal VDD1, and a drain terminal 124c of the second N-type transistor 124 connects to the first power terminal VDD1 via the first resistor 126. The low noise amplifier 120 is used for amplifying the radio frequency signal $v_{in}$(t) to provide an injection signal $v_{inj}$, wherein the injection signal $v_{inj}$ is outputted from the drain terminal 124c of the second N-type transistor 124.

With reference to FIGS. 1 and 2, the first balun 130 connects to the low noise amplifier 120 and receives the injection signal $v_{inj}$ to generate a first differential signal $v_{rf-}$ and a second differential signal $v_{rf+}$. Referring to FIG. 2, in this embodiment, the first balun 130 is an active balun and comprises a second capacitor 131, a third N-type transistor 132, a fourth N-type transistor 133, a second bias resistor 134, a second resistor 135 and a third resistor 136, wherein one end of the second capacitor 131 connects to the drain terminal 124c of the second N-type transistor 124 for receiving the injection signal $v_{inj}$, the other end of the second capacitor 131 connects to a gate terminal 132a of the third N-type transistor 132 to make the third N-type transistor 132 receive the injection signal $v_{inj}$, the gate terminal 132a of the third N-type transistor 132 receives a second bias voltage $V_{B2}$ via the second bias resistor 134, a drain terminal 132c of the third N-type transistor 132 connects to the first power terminal VDD1 via the second resistor 135, a source terminal 132b of the third N-type transistor 132 is grounded via the third resistor 136, a drain terminal 133c of the fourth N-type transistor 133 connects to the source terminal 132b of the third N-type transistor 132, wherein a gate terminal 133a of the fourth N-type transistor 133 and a source terminal 133b of the fourth N-type transistor 133 are grounded, wherein the drain terminal 132c and the source terminal 132b of the third N-type transistor 132 provide the first differential signal $v_{rf-}$ and the second differential signal $v_{rf+}$ respectively, wherein the first differential signal $v_{rf-}$ and the second differential signal $v_{rf+}$ are mutually inverted to provide the sub-harmonic mixer 150 of the rear end with a differential signal.

Figure 3:
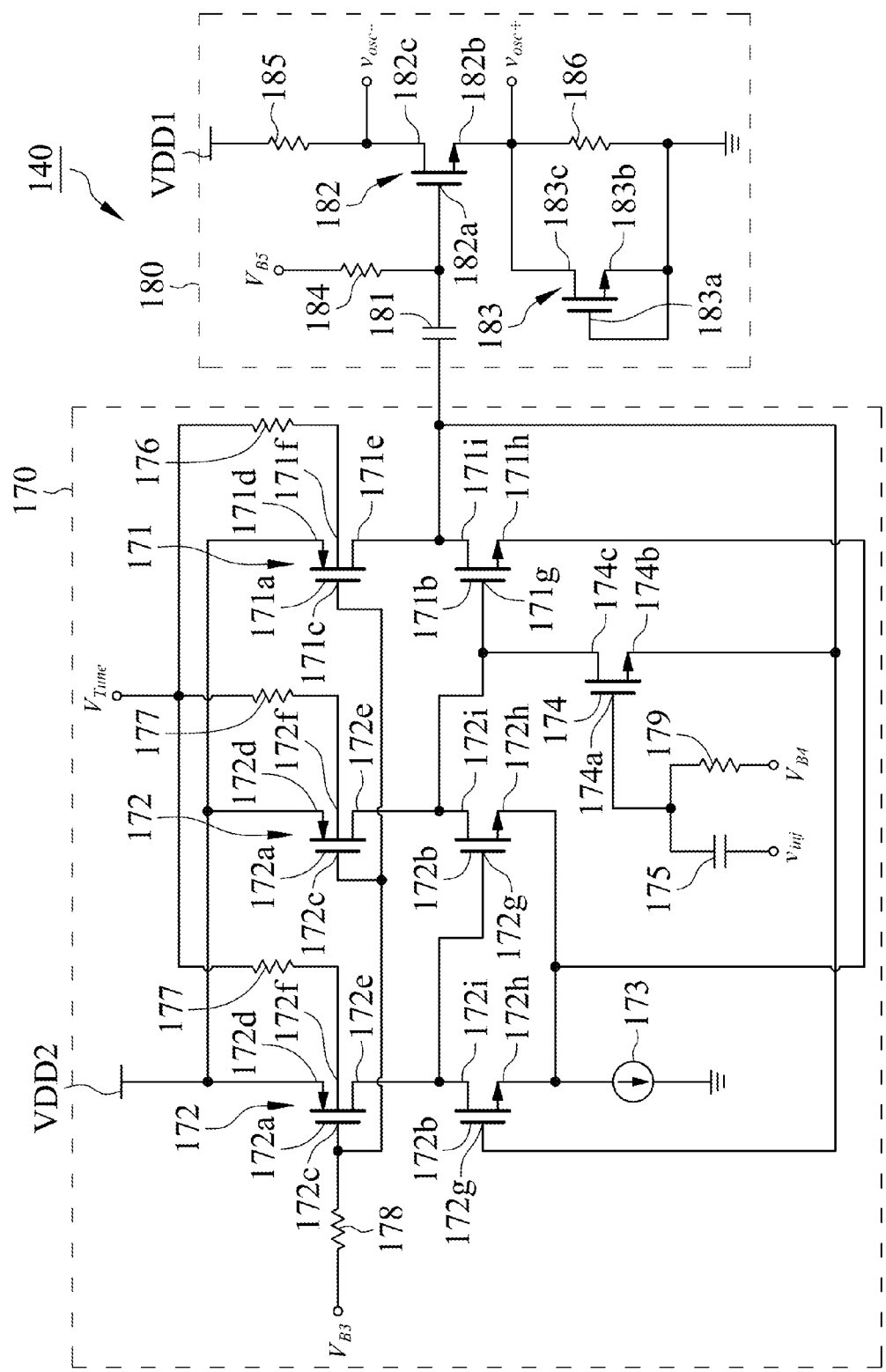
FIG. 3 is the circuit diagram illustrating an injection-lock divide-by-2 frequency divider in accordance with the embodiment of the present invention.

Referring to FIGS. 1, 2 and 3, the injection-lock divide-by-2 frequency divider 140 connects to the low noise amplifier 120 and receives the injection signal $v_{inj}$. With reference to FIG. 3, the injection-lock divide-by-2 frequency divider 140 comprises a ring oscillator 170 and a second balun 180 connected to the ring oscillator 170, and the ring oscillator 170 connects to the low noise amplifier 120 for receiving the injection signal $v_{inj}$. In this embodiment, the ring oscillator 170 is a three-stage oscillator and comprises a first oscillation device 171, two second oscillation devices 172, a current source 173, an input transistor 174, a third capacitor 175, a first input resistor 176, two second input resistors 177, a third bias resistor 178 and a fourth bias resistor 179. The first oscillation device 171 comprises a first P-type oscillating transistor 171a and a first N-type oscillating transistor 171b, each of the second oscillation devices 172 comprises a second P-type oscillating transistor 172a and a second N-type oscillating transistor 172b, wherein a gate terminal 171c of the first P-type oscillating transistor 171a receives a third bias voltage $V_{B3}$ via the third bias resistor 178, a source terminal 171d of the first P-type oscillating transistor 171a connects to a second power terminal VDD2, a body terminal 171f of the first P-type oscillating transistor 171a receives an adjusting voltage $V_{Tune}$ via the first input resistor 176, a drain terminal 171i of the first N-type oscillating transistor 171b connects to a drain terminal 171e of the first P-type oscillating transistor 171a, a gate terminal 171g of the first N-type oscillating transistor 171b connects to a drain terminal 172i of one of the second N-type oscillating transistors 172b, wherein a source terminal 171h of the first N-type oscillating transistor 171b connects to the current source 173. A gate terminal 172c of each of the second P-type oscillating transistors 172a receives the third bias voltage $V_{B3}$ via the third bias resistor 178, a body terminal 172f of each of the second P-type oscillating transistors 172a receives the adjusting voltage $V_{Tune}$ via each of the second input resistors 177, a source terminal 172d of each of the second P-type oscillating transistors 172a connects to the second power terminal VDD2, the drain terminal 172i of each of the second N-type oscillating transistors 172b connects to a drain terminal 172e of the second P-type oscillating transistor 172a, a gate terminal 172g of one of the second N-type oscillating transistors 172b connects to the drain terminal 172i of another second N-type oscillating transistor 172b, the gate terminal 172g of one of the second N-type oscillating transistors 172b connects to the drain terminal 171i of the first N-type oscillating transistor 171b, a source terminal 172h of each of the second N-type oscillating transistors 172b connects to the current source 173.

Referring to FIG. 3, a gate terminal 174a of the input transistor 174 receives a fourth bias voltage $V_{B4}$ via the fourth bias resistor 179. The gate terminal 174a of the input transistor 174 also connects to the drain terminal 124c of the first N-type oscillating transistor 124 via the third capacitor 175 for receiving the injection signal $v_{inj}$, and a drain terminal 174c of the input transistor 174 connects to the gate terminal 171g of the first N-type oscillating transistor 171b so as to inject the injection signal $v_{inj}$ and to lock the ring oscillator 170 at a lock frequency $\omega_o(t)$, wherein the lock frequency $\omega_o(t)$ is half the operational frequency $\omega_i(t)$ of the radio frequency signal $v_{in}(t)$ therefore decreasing the power consumption that the injection lock requires.

With reference to FIG. 3, the second balun 180 is an active balun, the second balun 180 comprises a fourth capacitor 181, a fifth N-type transistor 182, a sixth N-type transistor 183, a fifth bias resistor 184, a fourth resistor 185 and a fifth resistor 186, one end of the fourth capacitor 181 connects to the drain terminal 171i of the first N-type oscillating transistor 171b, the other end of the fourth capacitor 181 connects to a gate terminal 182a of the fifth N-type transistor 182, the gate terminal 182a of the fifth N-type transistor 182 receives a fifth bias voltage $V_{B5}$ via the fifth bias resistor 184, a drain terminal 182c of the fifth N-type transistor 182 connects to the first power terminal VDD1 via the fourth resistor 185, a source terminal 182b of the fifth N-type transistor 182 is grounded via the fifth resistor 186, a drain terminal 183c of the sixth N-type transistor 183 connects to the source terminal 182b of the fifth N-type transistor 182, wherein a gate terminal 183a of the sixth N-type transistor 183 and a source terminal 183b of the sixth N-type transistor 183 are grounded, wherein the drain terminal 182c of the fifth N-type transistor 182 provide the first oscillation signal and the source terminal 182b of the fifth N-type transistor 182 provide the second oscillation signal $v_{osc+}$. Besides, the first oscillation signal $v_{osc-}$ and the second oscillation signal $v_{osc+}$ are mutually inverted to provide the sub-harmonic mixer 150 of the rear end with a differential oscillation signal.

With reference to FIGS. 1, 2, 3 and 4, the sub-harmonic mixer 150 connects to the first balun 130 and the injection-lock divide-by-2 frequency divider 140 for receiving the first differential signal $v_{rf-}$ and the second differential signal $v_{rf+}$ both outputted from the first balun 130 and receiving the first oscillation signal $v_{osc-}$ and the second oscillation signal $v_{osc+}$ both outputted from the injection-lock divide-by-2 frequency divider 140.

Figure 4:
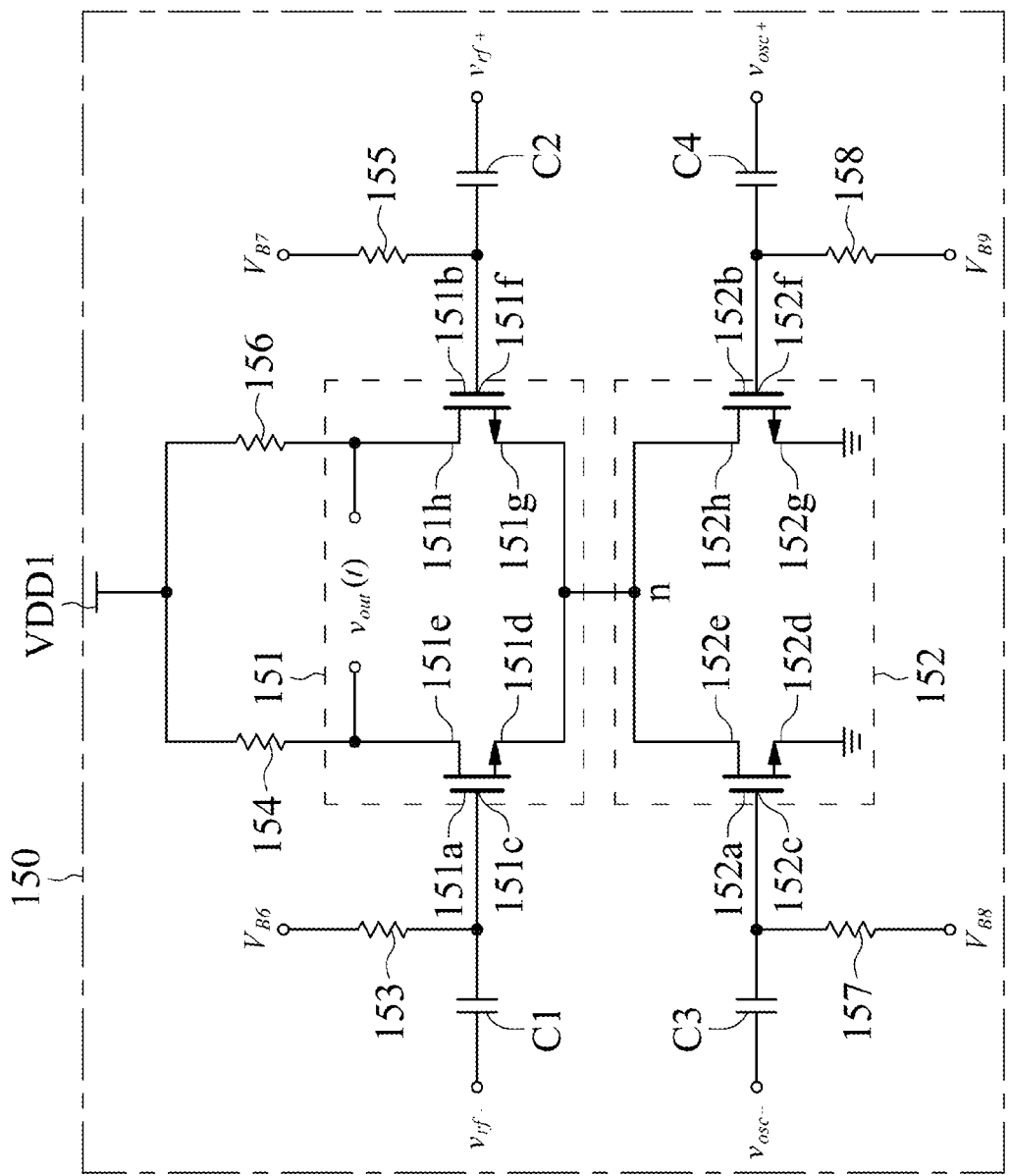
FIG. 4 is the circuit diagram illustrating a sub-harmonic mixer in accordance with the embodiment of the present invention.

Referring to FIG. 4, the sub-harmonic mixer 150 is stacked by two differential pairs and comprises a transconductance stage 151, a switch stage 152, a first coupling capacitor C1, a second coupling capacitor C2, a third coupling capacitor C3, a fourth capacitor C4, a sixth bias resistor 153, a sixth resistor 154, a seventh bias resistor 155, a seventh resistor 156, an eighth bias resistor 157 and a ninth bias resistor 158, wherein the transconductance stage 151 comprises a first differential transistor 151a and a second differential transistor 151b, a gate terminal 151c of the first differential transistor 151a receives the first differential signal $v_{rf-}$ via the first coupling capacitor C1. The gate terminal 151c of the first differential transistor 151a receives the sixth bias voltage $V_{B6}$ via the sixth bias resistor 153, and a drain terminal 151e of the first differential transistor 151a connects to the first power terminal VDD1 via the sixth resistor 154. A gate terminal 151f of the second differential transistor 151b receives the second differential signal $v_{rf+}$ via the second coupling capacitor C2. The gate terminal 151f of the second differential transistor 151b receives the seventh bias voltage $V_{B7}$ via the seventh bias resistor 155, and a drain terminal 151h of the second differential transistor 151b connects to the first power terminal VDD1 via the seventh resistor 156.

With reference to FIG. 4, the switch stage 152 connects to the transconductance stage 151 and comprises a third differential transistor 152a and a fourth differential transistor 152b. A gate terminal 152c of the third differential transistor 152a receives the first oscillation signal $v_{osc-}$ via the third coupling capacitor C3. The gate terminal 152c of the third differential transistor 152a receives the eighth bias voltage $V_{B8}$ via the eighth bias resistor 157. A gate terminal 152f of the fourth differential resistor 152b receives the second oscillation signal $v_{osc+}$ via the fourth coupling capacitor C4. The gate terminal 152f of the fourth differential transistor 152b receives the ninth bias voltage $V_{B9}$ via the ninth bias resistor 158. A source terminal 152d of the third differential transistor 152a and a source terminal 152g of the fourth differential transistor 152b are grounded, wherein a drain terminal 152e of the third differential transistor 152a and a drain terminal 152h of the fourth differential transistor 152b connect to the source terminal 151d of the first differential transistor 151a and the source terminal 151g of the second differential transistor 151b. The first oscillation signal $v_{osc-}$ and the second oscillation signal $v_{osc+}$ received by the switch stage 152 are mutually inverted differential signals, thus, the frequency of the current formed at a node n of the switch stage 152 is two times the first oscillation signal $v_{osc-}$ and the second oscillation signal $v_{osc+}$. Besides, owing to the circuit characteristics of the node n, the sub-harmonic mixer 150 possesses excellent isolation to prevent the transconductance stage from DC displacement caused by the first oscillation signal $v_{osc-}$ and the second oscillation signal $v_{osc+}$ therefore improving the sensitivity of the frequency shift-keying reader circuit 100.

Referring to FIGS. 1 and 4, the voltage difference between the drain terminal 151e of the first differential transistor 151a and the drain terminal 151h of the second differential transistor 151b is the output signal $v_{out}(t)$. The low-pass filter 160 connects to the sub-harmonic mixer 150 for receiving the output signal $v_{out}(t)$ and filtering the output signal $v_{out}(t)$ therefore achieving the demodulation of radio frequency signal.

In the present invention, the lock frequency $\omega_o(t)$ of the injection-lock divide-by-2 frequency divider 140 is half the operational frequency $\omega_t(t)$ of the radio frequency signal $v_{in}(t)$, thus, the power consumption for injection lock is well reduced. Besides, due to excellent isolation of the sub-harmonic mixer 150, the DC displacement output of the frequency shift-keying reader circuit 100 may be lowered effectively therefore making the sensitivity of the frequency shift-keying reader circuit 100 improved substantially. The frequency shift-keying reader circuit 100 in the present invention meets the Spec demand of short distance wireless communication owing to the characteristics of low power consumption and high sensitivity.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A frequency shift-keying reader circuit includes:
   a band-pass filter for receiving a radio frequency signal and performing a filtering procedure, wherein the radio frequency signal comprises an operational frequency;
   a low noise amplifier for connecting to the band-pass filter and receiving the filtered radio frequency signal, wherein the low noise amplifier is used for amplifying the radio frequency signal to provide an injection signal;
   a first balun for connecting to the low noise amplifier and receiving the injection signal, the first balun generates the first differential signal and the second differential signal, wherein the first differential signal and the second differential signal are mutually inverted;
   an injection-lock divide-by-2 frequency divider for connecting to the low noise amplifier and receiving the injection signal, wherein the injection-lock divide-by-2 frequency divider is locked at a lock frequency by the injection signal, the lock frequency is half the operational frequency, the injection-lock divide-by-2 frequency divider provides a first oscillation signal and a second oscillation signal, wherein the first oscillation signal and the second oscillation signal are mutually inverted;
   a sub-harmonic mixer for connecting to the first balun and the injection-lock divide-by-2 frequency divider, the sub-harmonic mixer receives the first differential signal, the second differential signal, the first oscillation signal and the second oscillation signal for performing a mixing procedure and generates an output signal; and
   a low-pass filter, the low-pass filter connects to the sub-harmonic mixer and performs a filtering procedure to the output signal.

2. The frequency shift-keying reader circuit in accordance with claim 1, wherein the low noise amplifier comprises an inductor, a first capacitor, a first N-type transistor and a second N-type transistor, one end of the inductor receives the filtered radio frequency signal, the other end of the inductor connects to one end of the first capacitor, the other end of the first capacitor connects to a gate terminal of the first N-type transistor, the gate terminal of the first N-type transistor receives a first bias voltage, a source terminal of the first N-type transistor is grounded, a source terminal of the second N-type transistor connects to a drain terminal of the first N-type transistor, wherein a gate terminal of the second N-type transistor and a drain terminal of the second N-type transistor connects to a first power terminal.

3. The frequency shift-keying reader circuit in accordance with claim 2, wherein the low noise amplifier comprises a first bias resistor and a first resistor, the gate terminal of the first N-type transistor receives the first bias voltage via the first bias resistor, the drain terminal of the second N-type transistor connects to the first power terminal via the first transistor.

4. The frequency shift-keying reader circuit in accordance with claim 2, wherein the first balun comprises a second capacitor, a third N-type transistor and a fourth N-type transistor, one end of the second capacitor connects to the drain terminal of the second N-type transistor, the other end of the second capacitor connects to a gate terminal of the third N-type transistor, the gate terminal of the third N-type transistor receives a second bias voltage, a drain terminal of the third N-type transistor connects to the first power terminal, a drain terminal of the fourth N-type transistor connects to a source terminal of the third N-type transistor, wherein a gate terminal of the fourth N-type transistor and a source terminal of the fourth N-type transistor are grounded, wherein the drain terminal of the third N-type transistor and the source terminal of the third N-type transistor provide the first differential signal and the second differential signal respectively.

5. The frequency shift-keying reader circuit in accordance with claim 4, wherein the first balun comprises a second bias resistor, a second resistor and a third resistor, the gate terminal of the third N-type transistor receives the second bias voltage via the second bias resistor, the drain terminal of the third N-type transistor connects to the first power terminal via the second resistor, and the source terminal of the third N-type transistor is grounded via the third resistor.

6. The frequency shift-keying reader circuit in accordance with claim 4, wherein the injection-lock divide-by-2 frequency divider comprises a ring oscillator and a second balun, the ring oscillator connects to the low noise amplifier, the second balun connects to the ring oscillator, and the second balun outputs the first oscillation signal and the second oscillation signal.

7. The frequency shift-keying reader circuit in accordance with claim 6, wherein the ring oscillator comprises a first oscillation device, a plurality of second oscillation devices, a current source, an input transistor and a third capacitor, the first oscillation device comprises a first P-type oscillating transistor and a first N-type oscillating transistor, each of the second oscillation devices comprises a second P-type oscillating transistor and a second N-type oscillating transistor, wherein a gate terminal of the first P-type oscillating transistor receives a third bias voltage, a source terminal of the first P-type oscillating transistor connects to a second power terminal, a body terminal of the first P-type oscillating transistor receives an adjusting voltage, a drain terminal of the first N-type oscillating transistor connects to a drain terminal of the first P-type oscillating transistor, a gate terminal of the first N-type oscillating transistor connects to a drain terminal of the input transistor and a drain terminal of one of the second N-type oscillating transistors, wherein a source terminal of the first N-type oscillating transistor connects to the current source, a gate terminal of each of the second P-type oscillating transistors receives the third bias voltage, a source terminal of each of the second P-type oscillating transistors connects to the second power terminal, a body terminal of each of the second P-type oscillating transistors receives the adjusting voltage, a drain terminal of each of the second N-type oscillating transistors connects to a drain terminal of the second P-type oscillating transistor, a gate terminal of each of the second N-type oscillating transistors connects to the drain terminal of another second N-type oscillating transistor, the gate terminal of one of the second N-type oscillating transistors connects to the drain terminal of the first N-type oscillating transistor, a source terminal of each of the second N-type oscillating transistors connects to the current source, a gate terminal of the input transistor receives a fourth bias voltage and connects to the drain terminal of the second N-type oscillating transistor via the third capacitor for receiving the injection signal, and a source terminal of the input transistor connects to the drain terminal of the first N-type oscillating transistor.

8. The frequency shift-keying reader circuit in accordance with claim 7, wherein the ring oscillator comprises a first input resistor, a plurality of second input resistors, a third bias resistor and a fourth bias resistor, the body terminal of the first P-type oscillating transistor receives the adjusting voltage via the first input resistor, the gate terminal of the first P-type oscillating transistor receives the third bias voltage via the third bias resistor, the body terminal of each of the second P-type oscillating transistors receives the adjusting voltage via each of the second input resistors, the gate terminal of each of the second P-type oscillating transistors receives the third bias voltage via the third bias resistor, and the gate terminal of the input transistor receives the fourth bias voltage via the fourth bias resistor.

9. The frequency shift-keying reader circuit in accordance with claim 7, wherein the second balun comprises a fourth capacitor, a fifth N-type transistor and a sixth N-type transistor, one end of the fourth capacitor connects to the drain terminal of the first N-type oscillating transistor, the other end of the fourth capacitor connects to a gate terminal of the fifth N-type transistor, the gate terminal of the fifth N-type transistor receives a fifth bias voltage, a drain terminal of the fifth N-type transistor connects to the first power terminal, a drain terminal of the sixth N-type transistor connects to a source terminal of the fifth N-type transistor, wherein a gate terminal of the sixth N-type transistor and a source terminal of the sixth N-type transistor are grounded, wherein the drain terminal of the fifth N-type transistor and the source terminal of the fifth N-type transistor provide the first oscillation signal and the second oscillation signal respectively.

10. The frequency shift-keying reader circuit in accordance with claim 9, wherein the second balun comprises a fifth bias resistor, a fourth resistor and a fifth resistor, the gate terminal of the fifth N-type transistor receives the fifth bias voltage via the fifth bias resistor, the drain terminal of the fifth N-type transistor connects to the first power terminal via the fourth resistor, and the source terminal of the fifth N-type transistor is grounded via the fifth resistor.

11. The frequency shift-keying reader circuit in accordance with claim 1, wherein the sub-harmonic mixer comprises a transconductance stage and a switch stage connected to the transconductance stage, the transconductance stage receives the first differential signal and the second differential signal and outputs the output signal, and the switch stage receives the first oscillation signal and the second oscillation signal.

12. The frequency shift-keying reader circuit in accordance with claim 11, wherein the transconductance stage comprises a first differential transistor and a second differential transistor, a gate terminal of the first differential transistor receives the first differential signal and a sixth bias voltage, a drain terminal of the first differential transistor connects to the first power terminal, a gate terminal of the second differential transistor receives the second differential signal and a seventh bias voltage, a drain terminal of the second differential transistor connects to the first power terminal, wherein the voltage difference between the drain terminal of the first differential transistor and the drain terminal of the second differential transistor is the output signal.

13. The frequency shift-keying reader circuit in accordance with claim 12, wherein the sub-harmonic mixer comprises a first coupling capacitor, second coupling capacitor, a sixth bias resistor, a sixth resistor, a seventh bias resistor and a seventh resistor, the gate terminal of the first differential transistor receives the first differential signal via the first coupling capacitor, the gate terminal of the first differential transistor receives the sixth bias voltage via the sixth bias resistor, the drain terminal of the first differential transistor connects to the first power terminal via the sixth resistor, the gate terminal of the second differential transistor receives the second differential signal via the second coupling capacitor, the gate terminal of the second differential transistor receives the seventh bias voltage via the seventh bias resistor, the drain terminal of the second differential transistor connects to the first power terminal via the seventh resistor.

14. The frequency shift-keying reader circuit in accordance with claim 12, wherein the switch stage comprises a third differential transistor and a fourth differential transistor, a gate terminal of the third differential transistor receives the first oscillation signal and an eighth bias voltage, a gate terminal of the fourth differential transistor receives the second oscillation signal and a ninth bias voltage, wherein a drain terminal of the third differential transistor and a drain terminal of the fourth differential transistor connect to a source terminal of the first differential transistor and a source terminal of the second differential transistor, wherein a source terminal of the third differential transistor and a source terminal of the fourth differential transistor are grounded.

15. The frequency shift-keying reader circuit in accordance with claim 14, wherein the sub-harmonic mixer comprises a third coupling capacitor, a fourth coupling capacitor, an eighth bias resistor and a ninth bias resistor, the gate terminal of the third differential transistor receives the first oscillation signal via the third coupling capacitor, the gate terminal of the third differential transistor receives the eighth bias voltage via the eighth bias resistor, the gate terminal of the fourth differential transistor receives the second oscillation signal via the fourth coupling capacitor, and the gate terminal of the fourth differential transistor receives the ninth bias voltage via the ninth bias resistor.

\* \* \* \* \*